US006069817A

United States Patent [19]

Shin et al.

[11] Patent Number: 6,069,817

[45] Date of Patent: May 30, 2000

[54] MEMORY DEVICE EVALUATION METHODS USING TEST CAPACITOR PATTERNS

[75] Inventors: Dong-won Shin; Jin-woo Lee, both of Kyungki-do, Rep. of Korea

[73] Assignee: Samsung Electronics Co., Ltd., Rep. of Korea

[21] Appl. No.: 09/201,694

[22] Filed: Nov. 30, 1998

[30] Foreign Application Priority Data

Dec. 3, 1997 [KR] Rep. of Korea ...................... 97-65543

[51] Int. Cl.[7] ..................................................... G11C 11/22

[52] U.S. Cl. ............................................ 365/145; 365/201

[58] Field of Search .................................... 365/145, 149, 365/201

[56] References Cited

U.S. PATENT DOCUMENTS

| | | | |
|---|---|---|---|
| 5,254,482 | 10/1993 | Fisch | 437/8 |
| 5,424,975 | 6/1995 | Lowrey et al. | 365/145 |
| 5,525,528 | 6/1996 | Perino et al. | 437/7 |
| 5,532,953 | 7/1996 | Ruesch et al. | 365/145 |
| 5,638,318 | 6/1997 | Seyyedy | 365/145 |
| 5,835,400 | 11/1998 | Jeon et al. | 365/145 |

OTHER PUBLICATIONS

Materials Research Society, Symposium Proceeding vol. 493, "Ferroelectric Thin Films VI," Nov. 30–Dec. 4, 1997, Boston, Massachusetts.

Materials Research Society, Abstract, Session U9: Pb–Based Ferroelectrics; 1997 Fall Meeting, Dec. 1, 1997, Boston, Massachusetts.

*Primary Examiner*—David Nelms
*Assistant Examiner*—Anh Phung
*Attorney, Agent, or Firm*—Myers Bigel Sibley & Sajovec

[57] ABSTRACT

A ferroelectric memory device formed on a microelectronic substrate is evaluated. The memory device includes a sense amplifier and a plurality of ferroelectric capacitors that are operatively connected to the sense amplifier to read information stored in the ferroelectric capacitors. A plurality of test ferroelectric capacitors is formed on the microelectronic substrate. Polarization characteristics are determined for the plurality of test ferroelectric capacitors. An input to the sense amplifier is estimated from the determined polarization characteristics, and the ferroelectric memory device is evaluated based on the estimated input. The estimated input may be compared to an input criterion, e.g., a minimum sensing charge or voltage for the sense amplifier, and the ferroelectric memory device may be either rejected or subjected to further testing depending on whether the estimated input fails to meet or meets the input criterion.

19 Claims, 3 Drawing Sheets

MEMORY DEVICE EVALUATION METHODS USING TEST CAPACITOR PATTERNS

FIELD OF THE INVENTION

The present invention relates to evaluation methods for microelectronic devices, and more particularly, to methods of evaluating ferroelectric devices.

BACKGROUND OF THE INVENTION

Ferroelectric memory devices typically include one or more arrays of ferroelectric capacitors that are used as data storage elements. A ferroelectric capacitor typically includes a dielectric formed from a ferroelectric material, disposed between respective conductive "plate" and "storage" electrodes. When a sufficient voltage is applied across the electrodes of the ferroelectric capacitor, the ferroelectric material exhibits a persistent polarization wherein the dipoles of the ferroelectric material arrange themselves along in a predetermined direction. This polarization state remains even when the applied electric field is removed. Thus, ferroelectric capacitors can and have been used as data storage devices.

A typical hysteresis characteristic for a ferroelectric capacitor is shown in FIG. 1, in which the horizontal axis represents a voltage applied across the electrodes of a ferroelectric capacitor, and the vertical axis represents polarization of the ferroelectric dielectric of the capacitor. As illustrated in FIG. 1, polarization of a ferroelectric dielectric occurs according to a predetermined hysteresis loop. When a positive voltage applied to the ferroelectric-dielectric film reaches a predetermined magnitude (point B), a positive polarization +Pm is induced. When the voltage applied to the dielectric is decreased to 0V, the ferroelectric dielectric remains positively polarized at a positive remnant polarization +Pr (point C). If the applied voltage is then sufficiently decreased (point D), a polarization reversal is induced, producing a negative polarization −Pm. Then, when the applied voltage is increased to 0V, the ferroelectric dielectric remains negatively polarized at a negative remnant polarization −Pr (point A). If the applied voltage is sufficiently increased (point B), the ferroelectric dielectric will undergo another polarization reversal back to a positive polarization state (point B).

Conventional processes for testing ferroelectric memory devices typically include a direct current (DC) test that tests the operation of input/output protection circuits connected to the ferroelectric capacitor memory array. This DC test typically is followed by an alternating current (AC) test that tests the polarization characteristics of the ferroelectric capacitors, as well as operation of associated peripheral circuits such as sense amplifiers. This AC test typically requires a long time to complete.

SUMMARY OF THE INVENTION

In light of the foregoing, it is an objective of the present invention to provide methods for evaluating ferroelectric memory devices that can provide for reduced testing time and improved process efficiency.

This and other objects, features and advantages are provided according to the present invention by methods for evaluating ferroelectric memory devices on a microelectronic substrate, e.g., a semiconductor wafer, in which polarization characteristics are determined for a plurality of test ferroelectric capacitors formed on the same wafer as the memory device, and the polarization characteristics for the test capacitors are used to estimate inputs to the sense amplifiers of the memory device to determine whether the ferroelectric capacitors of the memory device are likely to provide sufficient discrimination to operate correctly with the sense amplifiers of the device. For example, respective mean values and standard deviations for switching and non-switching charge levels of the test capacitors may be determined, and then used to determine an input charge that is compared to a minimum sensing charge for the sense amplifier. The switching and non-switching charges may be determined by a simplified test that can be completed in a shorter time than conventional AC tests, thus providing a way to pre-screen wafers before they are sent on for AC testing or other processing.

In particular, according to the present invention, a ferroelectric memory device formed on a microelectronic substrate is tested. The memory device includes a sense amplifier and a plurality of ferroelectric capacitors that are operatively connected to the sense amplifier to read information stored in the ferroelectric capacitors. A plurality of test ferroelectric capacitors is also formed on the microelectronic substrate. Polarization characteristics are determined for the plurality of test ferroelectric capacitors. An input to the sense amplifier is estimated from the determined polarization characteristics, and the ferroelectric memory device is evaluated based on the estimated input. For example, the estimated input may be compared to an input criterion for the sense amplifier, and the ferroelectric memory device may be either rejected or subjected to further testing device depending on whether the estimated input fails to meet or meets the input criterion.

According to an aspect of the present invention, statistics for a first polarization state response and a second polarization response are generated for the plurality of test ferroelectric capacitors from the determined polarization characteristics. An input is then estimated from the generated statistics, the estimated input representing a median value between a predetermined deviation of the first polarization state response and a predetermined deviation of the second polarization state response. The statistics may comprise a mean first polarization state response, a standard deviation of the first polarization response, a mean second polarization response and a standard deviation of the second polarization response. The estimated input may represent a medial value between a first deviation from the mean first polarization response and a second deviation from the mean second polarization response.

According to yet another aspect of the present invention, a switching voltage and a non-switching voltage are determined for each of the plurality of test ferroelectric capacitors. An input voltage or charge may then be estimated from the determined switching and non-switching voltages for the plurality of test ferroelectric capacitors, and then compared to a minimum sensing voltage or charge for the sense amplifier.

According to another aspect of the present invention, a remnant polarization voltage or charge is determined for each of the plurality of test ferroelectric capacitors. An input voltage or charge may be estimated from the remnant polarization voltage or charge, and compared to a minimum sensing voltage or charge for the sense amplifier.

In another embodiment according to the present invention, a plurality of groups of parallel connected test ferroelectric capacitors is formed on the substrate with the ferroelectric memory device. Respective polarization characteristics are determined for the groups of parallel-connected test ferroelectric capacitors, and used to estimate an input to the sense amplifier that is used to evaluate the ferroelectric memory device.

According to another aspect of the present invention, a memory device that includes a sense amplifier and a plurality of storage capacitors that are operatively connected to the sense amplifier to read information stored in the storage capacitors is evaluated by forming a plurality of test storage capacitors on the same microelectronic substrate as the memory device. Output characteristics for the plurality of test storage capacitors are determined and used to estimate an input to the sense amplifier of the memory device. The memory device may then be evaluated based on the estimated input. Improved memory device testing and fabrication may thereby be provided.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
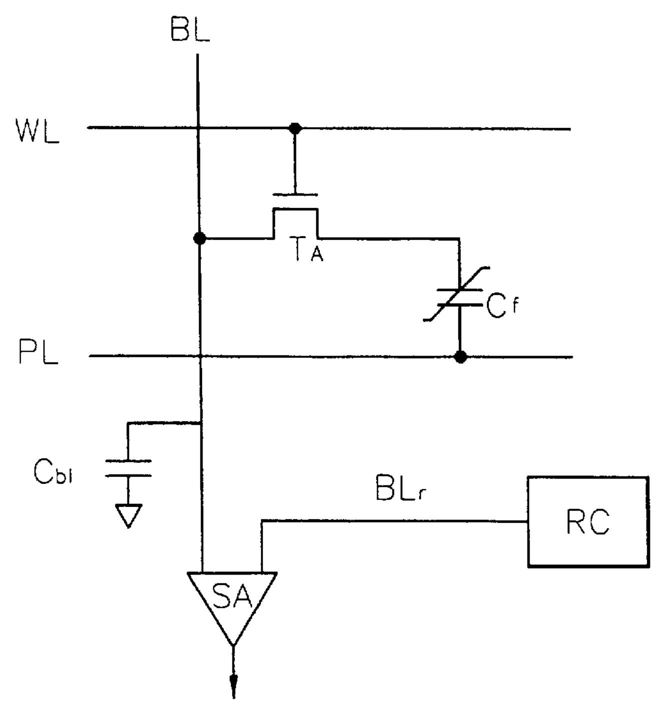
FIG. 2 is a schematic diagram illustrating a cell of a conventional ferroelectric memory device.

A typical configuration of a ferroelectric memory cell is provided in FIG. 2, including a ferroelectric capacitor $C_f$, an access transistor $T_A$, word line WL, bit line BL, sense amplifier SA and a reference cell RC. The ferroelectric capacitor $C_f$ has a storage electrode connected to a source (or drain) of the access transistor $T_A$, and a plate electrode connected to the plate line PL. A gate and a drain (or source) of the access transistor $T_A$ are connected to the word line WL and the bit line BL, respectively. The bit line BL is connected to one of two inputs of the sense amplifier SA, and the other input of the sense amplifier SA is connected to the reference cell by another bit line $BL_r$. The sense amplifier SA amplifies the difference between the voltages of the bit lines BL, $BL_r$, and outputs information accordingly. For accurate determination of data stored in the ferroelectric capacitor $C_f$, the voltage difference between the bit lines BL and $BL_r$ generally must be greater than a sensing limit of the sense amplifier SA, e.g., a minimum sensing voltage. A parasitic capacitance $C_{bl}$ of the bit line BL typically is much larger than the capacitance $C_f$. Exemplary operations for ferroelectric memory devices are described in U.S. Pat. No. 5,835,400 to Jeon et al., assigned to the assignee of the present invention and incorporated by reference herein in its entirety.

Figure 3:
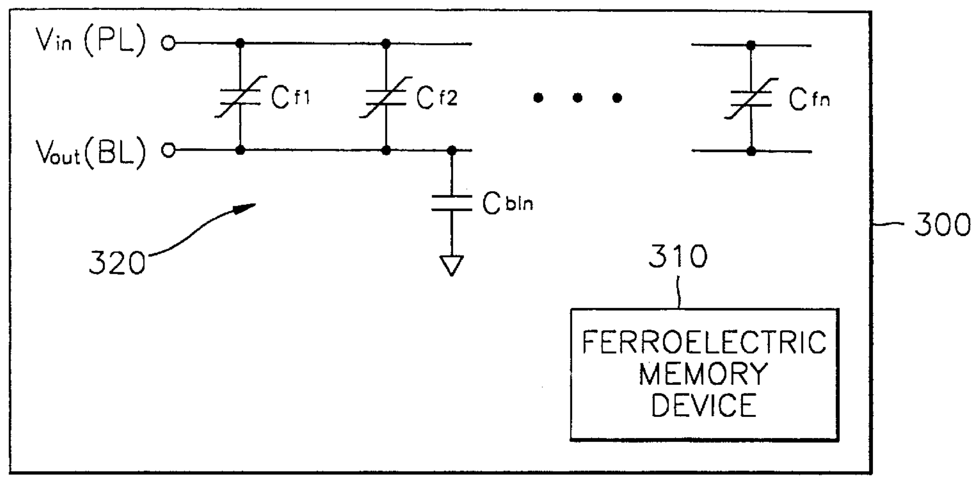
FIG. 3 is an equivalent circuit diagram of a test ferroelectric capacitor arrangement according to an embodiment of the present invention.

FIG. 3 is a schematic diagram of an exemplary ferroelectric capacitor test pattern or group 320 according to an embodiment of the present invention. The pattern 320 is formed on the same microelectronic substrate 300 as a ferroelectric memory device 310, e.g., a device having a memory cell structure such as that illustrated in FIG. 2. The pattern 320 includes a plurality of test ferroelectric capacitors $C_{f1}$–$C_{fn}$ that are connected in parallel. Plate electrodes and storage electrodes of the test ferroelectric capacitors are connected to a plate line PL and a bit line BL, respectively. It will be appreciated that the pattern 320 may have a construction similar to that of the ferroelectric device 310, i.e., access transistors such as the access transistor $T_A$ of FIG. 2 may be interposed between each of the storage electrodes of the test capacitors $C_{f1}$–$C_{fn}$ and the bit line BL. However, for purposes of testing polarization characteristics of the test capacitors $C_{f1}$–$C_{fn}$, access transistors need not be formed. A capacitor $C_{bln}$ having a capacitance n times the parasitic capacitance associated with a respective bit line of the ferroelectric memory device 310 may be connected between the bit line BL and a signal ground. The capacitor may be formed on the substrate 300, or may be an external capacitor positioned within external test equipment.

Figure 1:
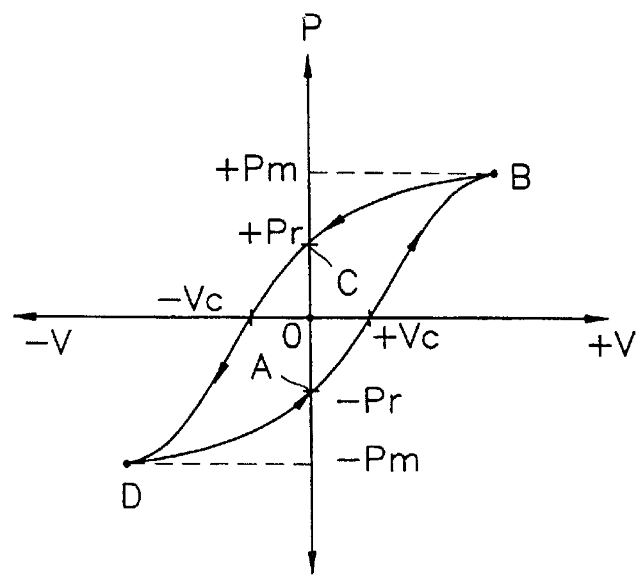
FIG. 1 illustrates a typical hysteresis loop characteristic for a ferroelectric dielectric.
Figure 4A:
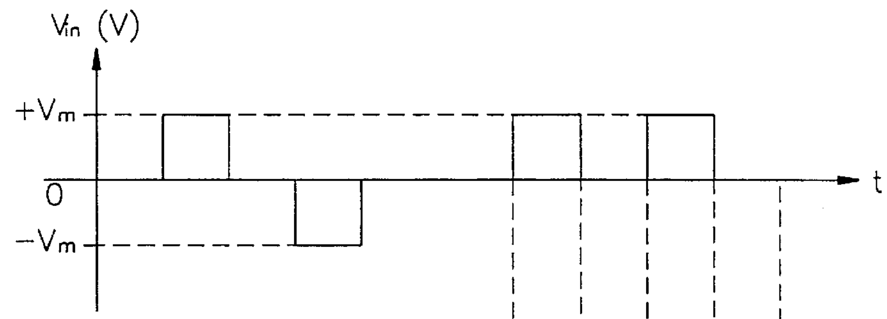
FIGS. 4A–4B illustrate waveforms for determining testing polarization characteristics of a ferroelectric capacitor.
Figure 4B:
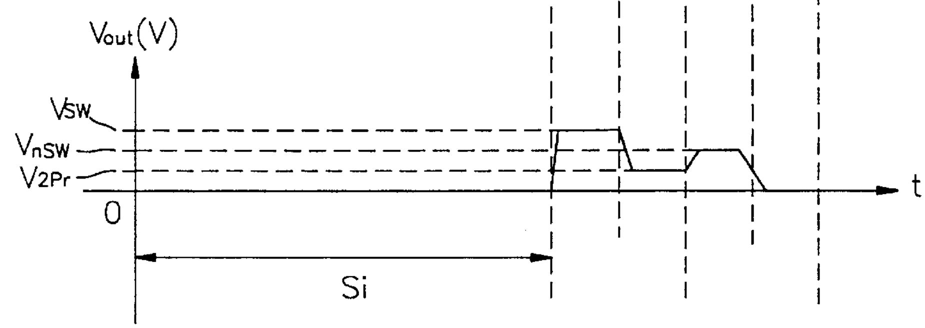

FIGS. 4A and 4B illustrate exemplary operations for determining polarization characteristics for a test ferroelectric capacitor pattern such as the pattern 320 of FIG. 3. In particular, FIG. 4A illustrates input voltages $V_{in}$ applied to the plate line PL of the test pattern 320, while FIG. 4B illustrates output voltages $V_{out}$ at the bit line BL of the test pattern 320. The test capacitors $C_{f1}$–$C_{fn}$, are first initialized to a first polarization state by sequentially applying a positive pulse signal $+V_m$ and a negative pulse signal $-V_m$ to the plate line PL, such that each ferroelectric capacitor has a negative remnant polarization −Pr (see FIG. 1) after the negative pulse signal $-V_m$ is removed.

A positive pulse signal $+V_m$ is then applied to the plate line PL, while the output voltage $V_{out}$, of the bit line BL is measured. The positive pulse signal $+V_m$ produces a polarization switch in the test capacitors $C_{f1}$–$C_{fn}$, and a switching voltage $V_{sw}$ on the bit line BL, e.g., a voltage corresponding to a logical switching of a ferroelectric memory element from a logic “0” to a logic “1”. The plate line PL is then taken to signal ground while the bit line voltage $V_{out}$ is again measured to determine a positive remnant polarization voltage $V_{2Pr}$ (corresponding to the polarization difference between points A and C of FIG. 1). Subsequently, while a positive pulse signal $+V_m$ is again applied to the plate line PL, the voltage of the bit line BL is measured to determine a non-switching voltage $V_{nsw}$ corresponding to the amount of charge difference between a positive maximum polarization +Pm and the positive remnant polarization +Pr (see FIG. 1). The polarization characteristics, e.g., the switching voltage $V_{sw}$, the non-switching voltage $V_{nsw}$, and the maximum remnant polarization voltage $V_{2Pr}$, may be converted into a corresponding switching charge $Q_{sw}$, non-switching charge $Q_{nsw}$ and maximum remnant polarization 2Pr, respectively, using the bit line capacitance $C_{bl}$ to integrate the output voltage $V_{out}$.

The polarization characteristics described above are determined for a plurality of such test patterns 320 formed on the substrate 300, thus producing a number of sets of polarization characteristics corresponding to the number of test patterns. The number of cell test patterns must be at least two, and preferably is greater than 5 in order to obtain statistically reliable results.

Those skilled in the art will appreciate that either the switching voltage $V_{sw}$ and the non-switching voltage $V_{nsw}$, or the maximum remnant polarization voltage $V_{2Pr}$, may be used to determine the logic state of a ferroelectric memory element, depending on the operational characteristics of the sense amplifier circuits used in the ferroelectric memory device 310. For example, a sense amplifier of the memory device 310 may sample the bit line when the "read" voltages $+V_m$ are applied to a ferroelectric memory cell of the device 310, e.g., the sense amplifier may sample voltages corresponding to the switching and non-switching voltages $V_{sw}$, $V_{nsw}$. Alternatively, a sense amplifier may sense the bit line voltage after the read voltage is deasserted, thus reading a voltage corresponding to difference between the positive remnant polarization +Pr and the negative remnant polarization −Pr.

Exemplary operations for estimating a sensing margin of a sense amplifier of a ferroelectric memory device will now be described. For a memory device having a sense amplifier that senses the bit line voltage while a read signal pulse is applied to the plate electrode of the cell, an estimated input $D_{on}$ to the sense amplifier may be determined as:

$$D_{ON} = (Q_{sw,mean} - x\sigma_{sw}) - \frac{(Q_{sw,mean} - x\sigma_{Qsw}) - Q_{nsw,mean} - x\sigma_{Qnsw}}{2}, \quad (1)$$

where $Q_{sw,mean}$ and $Q_{nsw,mean}$ represent respective mean switching and non-switching charges for the test ferroelectric capacitor patterns determined as described above, and $\sigma_{Qsw}$ and $\sigma_{Qnsw}$ represent respective standard deviations for the switching and non-switching charges.

The estimated input $D_{ON}$ of equation (1) represents a worst case estimate of the charge applied to a sense amplifier of a ferroelectric memory device. The multiplier $\chi$ preferably is set to provide a close correlation between the test capacitor patterns and the actual ferroelectric memory storage capacitors of the device under evaluation. The sensing margin of the sense amplifier of a memory device formed on the same substrate as the test capacitor patterns represents a difference between the estimated input $D_{ON}$ and the minimum sensing charge of the sense amplifier, obtained by multiplying the minimum sense voltage of the amplifier (obtained, for example by simulation) by bit line capacitance $C_{bln}$. Thus, comparison of the estimated input charge $D_{ON}$ and the minimum sensing charge of the sense amplifier of a memory device can provide a high-reliability indication of whether the ferroelectric memory device will exhibit sensing errors.

For memory devices having a sense amplifier that senses the bit line voltage after the read pulse signal is de-asserted, an estimated input $D_{OFF}$ into the sense amplifier can be provided by:

$$D_{OFF}=(2Pr_{mean}-\chi\sigma_{2Pr})-(Pr_{mean}+\chi\sigma_{Pr}), \quad (2)$$

where $2Pr_{mean}$ represents the mean remnant polarization 2Pr for the test ferroelectric capacitor patterns determined as described above and $\sigma_{2Pr}$ represents the standard deviation of the remnant polarization 2Pr for the test patterns, and $Pr_{mean}$ and $\sigma_{2Pr}$ correspond to halves of the mean value $2Pr_{mean}$ and standard deviation $\sigma_{2Pr}$, respectively. Similar to the estimated input $D_{ON}$ described above, $D_{OFF}$ represents a "worst case" estimate of the input to a sense amplifier of a memory device that samples the bit line voltage after de-assertion of a read pulse. The estimated input charge $D_{OFF}$ may be compared with the minimum sensing charge of the sense amplifier to determine whether the device is likely to exhibit sensing errors.

Figure 5:
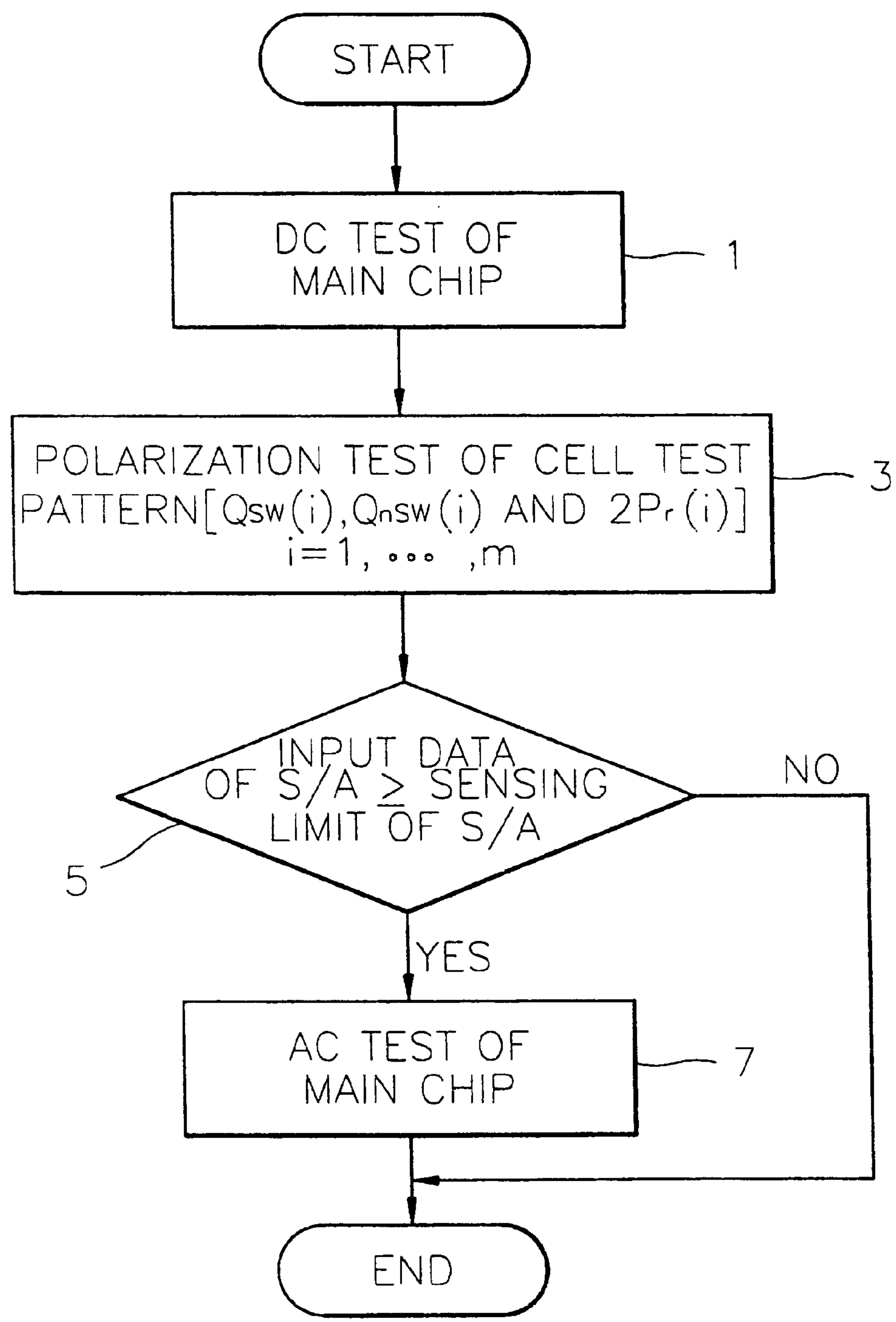
FIG. 5 is a flow chart illustrating operations for evaluating a ferroelectric memory device according to an aspect of the present invention.

FIG. 5 illustrates exemplary operations 500 for evaluating a ferroelectric memory device according to an embodiment of the present invention. A DC test is performed on the ferroelectric memory device (Block 1). Polarization characteristics are then determined for a plurality of test ferroelectric capacitors formed on the same substrate as the memory device, e.g., switching charges, non-switching charges and/or remnant polarization charges for a plurality of test patterns such as the pattern 320 of FIG. 3 (Block 3). An estimated input, e.g., $D_{ON}$ or $D_{OFF}$, is then computed and compared to the minimum input charge of the sense amplifier of the ferroelectric memory device (Block 5). If the estimated input charge is greater than the sensing limit of the sense amplifier, the device is subjected to further testing, e.g., an AC test (Block 7). If the estimated input charge is less than the minimum sensing charge, the device is rejected and further testing or other fabrication processing is not carried out.

According to the present invention, a ferroelectric memory device is evaluated using tests on a plurality of ferroelectric capacitors formed on the same substrate as the device. Using the test capacitors, the likelihood of the device exhibiting data sensing errors can be quickly determined without protracted AC testing. Thus, devices that have a high likelihood of exhibiting read errors can be identified before AC testing and other processing, offering potential improvements in manufacturing efficiency. Testing test capacitors can also more quickly reveal fabrication abnormalities, allowing for quicker repair of defects in the fabrication process.

The present invention is not limited to the above embodiment, and further modifications and alterations will occur to those skilled in the art. For example, the present application is also applicable to testing a device such as a dynamic random access memory (DRAM), which utilizes storage capacitors as memory storage elements. In such an embodiment, statistics for first and second logic state outputs or responses may be generated for a plurality of test storage capacitors formed on the same substrate as the DRAM under evaluation, and used to generate, for example, an estimated input voltage that will be provided to a sense amplifier of the DRAM. This estimated input may be used to determine the likelihood of read errors in the DRAM.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of evaluating a ferroelectric memory device formed on a microelectronic substrate, the memory device including a sense amplifier and a plurality of ferroelectric capacitors that are operatively connected to the sense amplifier, the method comprising the steps of:

forming a plurality of test ferroelectric capacitors on the microelectronic substrate;

determining polarization characteristics for the plurality of test ferroelectric capacitors;

estimating an input to the sense amplifier from the determined polarization characteristics; and evaluating the ferroelectric memory device based on the estimated input.

2. A method according to claim 1, wherein said step of evaluating comprises the step of comparing the estimated input to an input criterion for the sense amplifier.

3. A method according to claim 2, wherein said step of comparing is followed by the step of rejecting the ferroelectric memory device if the estimated input fails to meet the input criterion.

4. A method according to claim 3, wherein said step of comparing is followed by the step of performing an AC test on the ferroelectric memory device if the estimated input meets the input criterion.

5. A method according to claim 1, wherein said step of estimating comprises the steps of:

generating statistics for a first polarization state response and a second polarization state response for the plurality of test ferroelectric capacitors from the determined polarization characteristics; and estimating an input representing a median value between a predetermined deviation of the first polarization state response and a predetermined deviation of the second polarization state response from the generated statistics for the plurality of test ferroelectric capacitors.

6. A method according to claim 5:

wherein said step of generating statistics comprises the step of determining a mean first polarization state response, a standard deviation of the first polarization response, a mean second polarization response and a standard deviation of the second polarization response; and wherein said step of estimating an input comprises the step of estimating an input representing a median value between a first deviation from the mean first polarization response and a second deviation from the mean second polarization response.

7. A method according to claim 1, wherein said step of determining a respective polarization characteristic comprises the step of determining a switching voltage and a non-switching voltage for each of the plurality of test ferroelectric capacitors.

8. A method according to claim 7:

wherein said step of estimating an input comprises a step of estimating an input voltage from the determined switching and non-switching voltages for the plurality of test ferroelectric capacitors; and wherein said step of evaluating comprises the step of comparing the estimated input voltage to a minimum sensing voltage for the sense amplifier.

9. A method according to claim 7:

wherein said step of estimating an input comprises a step of estimating an input charge from the determined switching and non-switching voltages for the plurality of test ferroelectric capacitors; and wherein said step of evaluating comprises the step of comparing the estimated input charge to a minimum sensing charge for the sense amplifier.

10. A method according to claim 9, wherein said step of estimating an input charge comprises the steps of:

integrating the determined switching and non-switching voltages for each of the plurality of test ferroelectric capacitors to determine switching and non-switching charges for each of the plurality of test ferroelectric capacitors; and estimating an input charge from the determined switching and non-switching charges for the plurality of test ferroelectric capacitors.

11. A method according to claim 1, wherein said step of determining a respective polarization characteristic comprises the step of determining a remnant polarization voltage for each of the plurality of test ferroelectric capacitors.

12. A method according to claim 11:

wherein said step of estimating an input comprises a step of estimating an input voltage from the determined remnant polarization voltages for the plurality of test ferroelectric capacitors; and wherein said step of evaluating comprises the step of comparing the estimated input voltage to a minimum sensing voltage for the sense amplifier.

13. A method according to claim 11:

wherein said step of estimating an input comprises a step of estimating an input charge from the determined remnant polarization voltages for the plurality of test ferroelectric capacitors; and wherein said step of evaluating comprises the step of comparing the estimated input charge to a minimum sensing charge for the sense amplifier.

14. A method according to claim 13, wherein said step of estimating an input charge comprises the steps of:

integrating the determined remnant polarization voltages for each of the plurality of test ferroelectric capacitors to determine remnant polarization charges for each of the plurality of test ferroelectric capacitors; and estimating an input charge from the determined remnant polarization charges for the plurality of test ferroelectric capacitors.

15. A method according to claim 1:

wherein said step of forming a plurality of test ferroelectric capacitors comprises the step of forming a plurality of groups of parallel connected test ferroelectric capacitors; and wherein said step of determining polarization characteristics comprises the step of determining respective polarization characteristics for the groups of parallel-connected test ferroelectric capacitors.

16. A method according to claim 15, wherein said step of forming a plurality of groups of test ferroelectric capacitors comprises the step of forming a group of test ferroelectric capacitors having first electrodes connected in common, and further comprising the step of connecting a capacitance between the commonly connected test ferroelectric capacitors and a signal ground.

17. A method of evaluating a microelectronic device formed on a microelectronic substrate, the device including a sense amplifier and a plurality of storage capacitors that are operatively connected to the sense amplifier to read information stored in the storage capacitors, the method comprising the steps of:

forming a plurality of test storage capacitors on the microelectronic substrate;

determining output characteristics for the plurality of test storage capacitors;

estimating an input to the sense amplifier from the determined output characteristics; and evaluating the microelectronic device based on the estimated input.

18. A method according to claim 17, wherein said step of evaluating comprises the step of comparing the estimated input to an input criterion for the sense amplifier.

19. A method according to claim 17, wherein said step of estimating comprises the steps of:

generating statistics for a first logic state response and a second logic state response for the plurality of test storage capacitors from the determined output characteristics; and estimating an input to the sense amplifier from the generated statistics for the plurality of test storage capacitors.

* * * * *